United States Patent [19]
Heist et al.

[11] Patent Number: 5,282,918
[45] Date of Patent: Feb. 1, 1994

[54] APPARATUS FOR SEPARATING AND DRAWING OFF A FILM LAMINATED ON A CARRIER MATERIAL

[75] Inventors: Hans Heist, Wiesbaden; Stephan J. W. Platzer, Eltville; Martin Stork, Muehlheim/Main, all of Fed. Rep. of Germany

[73] Assignee: Hoechst Aktiengesellschaft, Frankfurt am Main, Fed. Rep. of Germany

[21] Appl. No.: 928,364

[22] Filed: Aug. 12, 1992

[30] Foreign Application Priority Data

Aug. 22, 1991 [DE] Fed. Rep. of Germany ....... 4127724

[51] Int. Cl.⁵ .............................................. B32B 35/00
[52] U.S. Cl. .................................... 156/344; 156/584; 430/259
[58] Field of Search .................. 156/247, 344, 584; 271/280, 281, 285, 900; 430/256, 259; 83/27, 375, 452

[56] References Cited

U.S. PATENT DOCUMENTS

| | | | |
|---|---|---|---|
| 4,285,759 | 8/1981 | Allen et al. ...................... | 430/259 X |
| 4,521,785 | 6/1985 | Matsufuji ........................ | 156/247 |
| 4,685,991 | 8/1987 | Herrmann et al. ................ | 156/344 |
| 4,752,346 | 6/1988 | Platzer .......................... | 156/344 |
| 4,956,044 | 9/1990 | Watanabe et al. ............... | 156/584 X |
| 5,091,042 | 2/1992 | Bruckner ........................ | 156/584 |

FOREIGN PATENT DOCUMENTS

| | | |
|---|---|---|
| 0214461 | 3/1987 | European Pat. Off. . |
| 0286961 | 10/1988 | European Pat. Off. . |
| 3339723 | 5/1985 | Fed. Rep. of Germany . |
| 3443939 | 6/1986 | Fed. Rep. of Germany . |
| 1572716 | 7/1980 | United Kingdom ................ 156/584 |

OTHER PUBLICATIONS

"Copper Peel Machine for Printed Circuit Boards," *IBM Technical Disclosure Bulletin*, vol. 31, No. 7, Dec. 1988, pp. 212–217.
IBM Technical Disclosure Bulletin; vol. 25, No. 11B; *Label Adhesive-Back Release Tool;* Pollard; Apr. 1983.

*Primary Examiner*—David A. Simmons
*Assistant Examiner*—Mark A. Osele
*Attorney, Agent, or Firm*—Foley & Lardner

[57] ABSTRACT

An apparatus for separating and drawing off a film from a laminate, the laminate including the film and a carrier material upon which the film is laminated. The apparatus includes a first plate; a second plate being disposed above the first plate; a motor; a spindle being operatively connected to the motor; a separating apparatus being movable along the spindle above the first plate and including a wedge-shaped separating knife; a gap which lies above and parallel to the separating knife and which is inclined at an oblique angle relative to a horizontal plane; and a stay passing vertically through the first plate which holds an underside of the laminate firmly in place. The laminate rests on the first plate, and the separating apparatus moves into engagement with a corner of the film such that the film corner is detached from the carrier material and is threaded into the gap. The stay holds the underside of the laminate firmly in place when the film corner is threaded into the gap.

29 Claims, 4 Drawing Sheets

APPARATUS FOR SEPARATING AND DRAWING OFF A FILM LAMINATED ON A CARRIER MATERIAL

BACKGROUND OF THE INVENTION

1. Field of the Invention

The invention relates to an apparatus for separating and drawing off a film laminated on a carrier material, having a base plate and a plate lying partly thereabove, at a distance.

2. Description of the Related Art

Light-sensitive layers or plies, such as for example exposed photoresist layers on circuit boards or color proof-films, are generally covered by protective films. In the production of color proof-films and printed circuit boards, a substrate is first coated with a light-sensitive material. The material is subsequently covered with a transparent film. This laminate of film and light-sensitive layer is then exposed image by image by a mask. This exposure effects an image-forming, differing adhesion of the photosensitive layer in such a way that the exposed parts adhere to the substrate with a stronger adhesion than the unexposed parts. When the protective film and the substrate are separated from each other, there is for example a positive image on the substrate and a negative image on the protective film.

In the production of circuit boards for electric circuits, the substrate is laminated with a light-sensitive dry resist film. The exposure of the dry resist film is performed with the aid of an imaging mask representing the electric circuit, and thereafter, the protective film is removed and the dry resist film is developed in various processing steps. The protective film on the dry resist film permits a largely dust-free exposure and the transport of the coated circuit boards in the stacked state. The circuit boards have specifically one or more borders which are free from the laminated-on protective film, so that the board can be grasped at these free borders by gripping tools or manually.

In the case of some laminating operations, it is desirable to completely transfer a coating from one surface to another surface, as is the case for example, when transferring a colored resin layer from a substrate to a receiving sheet. In such a case, the coated substrate and a receiving sheet laid thereupon are passed under pressure through a laminating nip of heated laminating rolls. The substrate and the receiving sheet are subsequently separated from each other and the colored resin layer is thereby transferred from the substrate to the receiving sheet. A problem in such transfer processes is the incompleteness of the transfer of the colored resin layer.

U.S. Pat. No. 4,752,346 describes an apparatus and a process for detaching and separating films adhesively bonded to one another. The apparatus comprises a platform of a metal or of a material of which the surface is provided with an electrically conductive layer. Over the surface there is a bar edge or a wedge. Both the bar edge and the platform surface are electrically grounded. The bar edge is positioned over the platform by means of supports at each end of the bar edge. The supports, which are surrounded by springs, are passed through the bar edge and protrude beyond it. Consequently, a variable gap can be formed between the underside of the bar edge and the surface of the platform, which makes it possible for laminates of different thicknesses, comprising substrate and film, to pass through the variable gap. For example, a colored photosensitive layer, which is covered by a receiving sheet, is applied to a transparent polyester film by means of an adhesive layer. This sandwich arrangement runs through the nip of laminating rolls and is subsequently introduced between the bar edge and the platform of the drawing-off apparatus. The transparent polyester film is drawn off over the bar edge by the film being bent upward over the edge angle and taken along the bevel of the bar edge. As a result, the polyester film is separated from the receiving sheet or the receiving film and a transfer of the adhesive layer and the colored photosensitive layer to the receiving sheet takes place.

German Offenlegungsschrift 3,443,939 discloses a process for removing the protective film from circuit boards laminated with exposed photoresist, with the aid of an adhering element in sheet form. The adhering element is adhesively attached to the protective film which is subsequently drawn off the circuit board substantially along its diagonal. In this case, the circuit board is adjusted by a turning apparatus in such a way that an angle of $0° < \alpha < 90°$ is set between the front edge of the board and the normal to the transporting direction. The front corner of the board is subsequently provided both on the upper side and on the underside with a double-sided adhesive adhering element in such a way that parts of the uncovered board, beyond the border of the protective film, are also grasped, and the protective film can be drawn off by means of rolls. The apparatus for carrying out the process comprises a transporting and adjusting device, by which the body in board form can be swivelled out of its transporting direction into a working position. Furthermore, the apparatus includes a device for applying a double-sided adhesive adhering element, which is designed in the form of tongs and has bodies in plate form for receiving bearing rollers, and a device for removing the adhering element and the protective film, bonded to the latter, of the body in board form. This apparatus has a system of rolls arranged axially parallel, with a device for keeping the distance between the rolls constant.

German offenlegungsschrift 3,339,723 discloses a process and an apparatus for detaching the protective film from laminated circuit boards, in which the laminated circuit boards run via transport rollers and are provided on their upper side and underside with a one-sided glued adhesive tape. The protective film is detached by a subsequent drawing-off of the applied adhesive tape over a bar edge and is subsequently transported away and stored. The bar edge and the circuit board form a drawing-off gap through which the circuit boards pass. The bar edge forms an angle of 45° with respect to the transporting apparatus, and the adjoining face likewise forms an angle of 45° with respect to the board plane.

In the case of the known apparatuses for detaching a protective film from a laminated circuit board, either a continuous or endless adhesive tape or individual, double-sided adhesive elements are used, a result of which is that additional material and considerable amounts of such material are required. Furthermore, further process steps are required in advance, in order to bring either the adhesive tape or the adhesive elements onto the protective film of the circuit board.

SUMMARY OF THE INVENTION

An object of the invention is to remedy the aforementioned problems and to provide an apparatus and a process with which a reliable, complete and fully automatic detaching of a film from a carrier material, on which one or more light-sensitive layers are applied, is performed, without requiring the use of an adhesive tape or an adhesive element.

This object is achieved by providing an apparatus for separating and drawing off a film from a laminate, the laminate including the film and a carrier material upon which the film is laminated. The apparatus includes: a first plate; a second plate being disposed above said first plate; a motor; a spindle being operatively connected to said motor; and a separating apparatus being movable along said spindle above the first plate and including a wedge-shaped separating knife, a gap which lies above and parallel to the separating knife, and which is inclined at an oblique angle relative to a horizontal plane; and a stay passing vertically through said first plate for holding an underside of the laminate firmly in place. The laminate rests on the first plate, and the separating apparatus moves into engagement with a corner of the film so that the corner is detached from the carrier material and is threaded into the gap. The stay holds the underside of the laminate firmly in place when the corner is threaded into the gap.

In another embodiment of the invention, the separating apparatus is fastened to the underside of an angled frame, the vertical leg of the frame having a roller which is rotatably mounted at its lower end.

In yet another embodiment of the invention, the separating knife forms the underside of the gap, and makes an oblique angle with the horizontal plane in the range of from 5° to 25°, and in particular, a range of from 10° to 20°, as viewed from the advancing direction of the separating apparatus toward its engagement with the corner of the film.

The above object is also met by providing a method for removing from a carrier material, a film which has been laminated thereon. The method includes the steps: advancing a separating apparatus having a separating knife and a gap which runs at an oblique angle to a horizontal plane, toward the film; aligning a diagonal of the film along the advancing direction of the separating apparatus; engaging the separating knif e with a corner of the film from the carrier material; threading the corner of the film into the gap; holding the corner of the film firmly in place in a self-clamping manner by the separating knife; lifting the separating apparatus off of a first plate; running the separation apparatus onto an upper side of a second plate which is disposed above the first plate, while concurrently performing the lifting step; and drawing the film off the carrier material due to the advancing of the separating apparatus and the performance of the lifting and running steps.

In the situation where large-format laminates and/or thin carrier materials, which do not fully fill the gap owing to their small thickness, are being processed, an additional clamping pressure is exerted on the film corner in the oblique gap, which assists the self-clamping of the film corner which is threaded into the gap.

BRIEF DESCRIPTION OF THE DRAWINGS

The invention is explained in more detail below with reference to two illustrative embodiments represented by a drawing, in which.

DETAILED DESCRIPTION OF THE PREFERRED EMBODIMENTS

Figure 1:
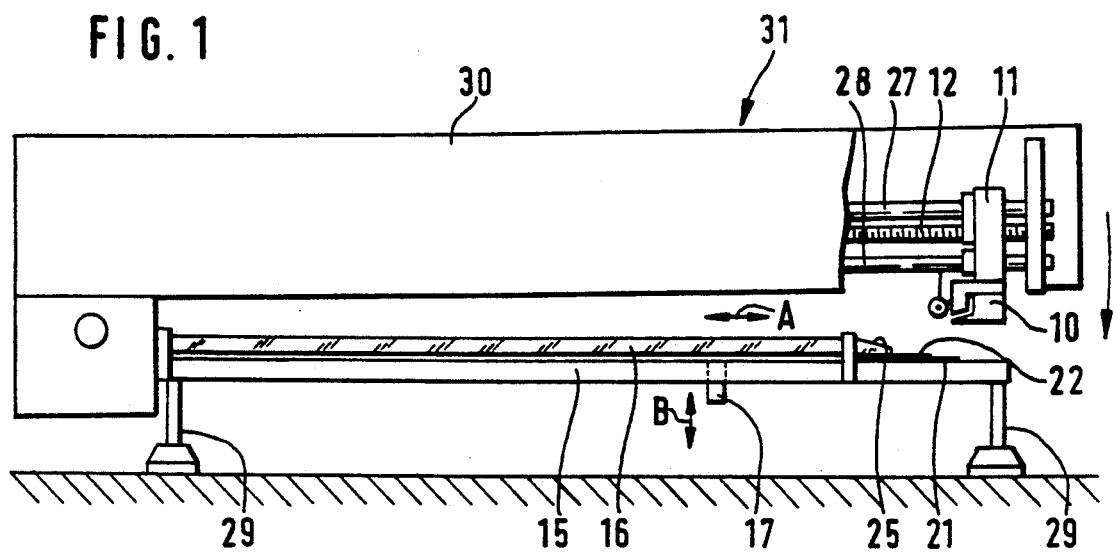
FIG. 1 is a side view of the apparatus according to the invention, partially cut-away.

In FIG. 1, an apparatus 31 for separating and drawing off a film 22 from a carrier material 21 is represented diagrammatically in side view. The apparatus 31 includes a base plate 15, which is supported on four standing legs 29, each leg 29 being supported at a respective corner of the base plate; a transparent plate 16, a spindle 12, which is driven by means of a motor 11 and on which there is seated a separating apparatus 10 which is able to travel back and forth over the base plate 15 as the double-headed arrow A shows; and a stay 17, which passes through the base plate 15 and can be raised and lowered, as the double-headed arrow B indicates. The transparent plate 16 is arranged over the base plate 15 at a predetermined distance and has a bevel 25. The carrier material 21 with the laminated-on film 22 passes through the gap formed between the base plate 15 and the plate 16. As can be seen from FIGS. 1 and 2, the plate 16 does not completely cover the base plate 15, but is shorter than the base plate 15 in the advancing direction of the separating apparatus 10.

The plate 16 is composed of a transparent material, for example glass or plastic, with glass being preferred. The carrier material 21 may be a film, on which for example a colored, light-sensitive synthetic resin layer is applied. The film 22 laminated thereover serves as receiving film for the colored synthetic resin layer, which in general is a polymer layer with a corresponding dye. During the detachment and separation of the film 22 from the carrier material 21, the colored synthetic resin layer is then transferred from the carrier material to the receiving film 22. Following this, the exposure of this color proof-film thus obtained is performed.

The carrier material 21 may also be a circuit board with a photoresist pattern exposed on it, in which case the film 22 is a protective film for the exposed photoresist pattern. After the circuit board has been exposed, the protective film is removed and the photoresist pattern is developed in various baths. The protective film must be removed without causing damage to the photoresist pattern and/or without residues of the protective film remaining on the photoresist film.

As can be seen from FIG. 1, a housing 30, which is shown partly cut-away, surrounds the spindle 12, and has parallel to guide rods 27 and 28, along which the separating apparatus 10 is moved by means of the guide 11.

Figure 2:
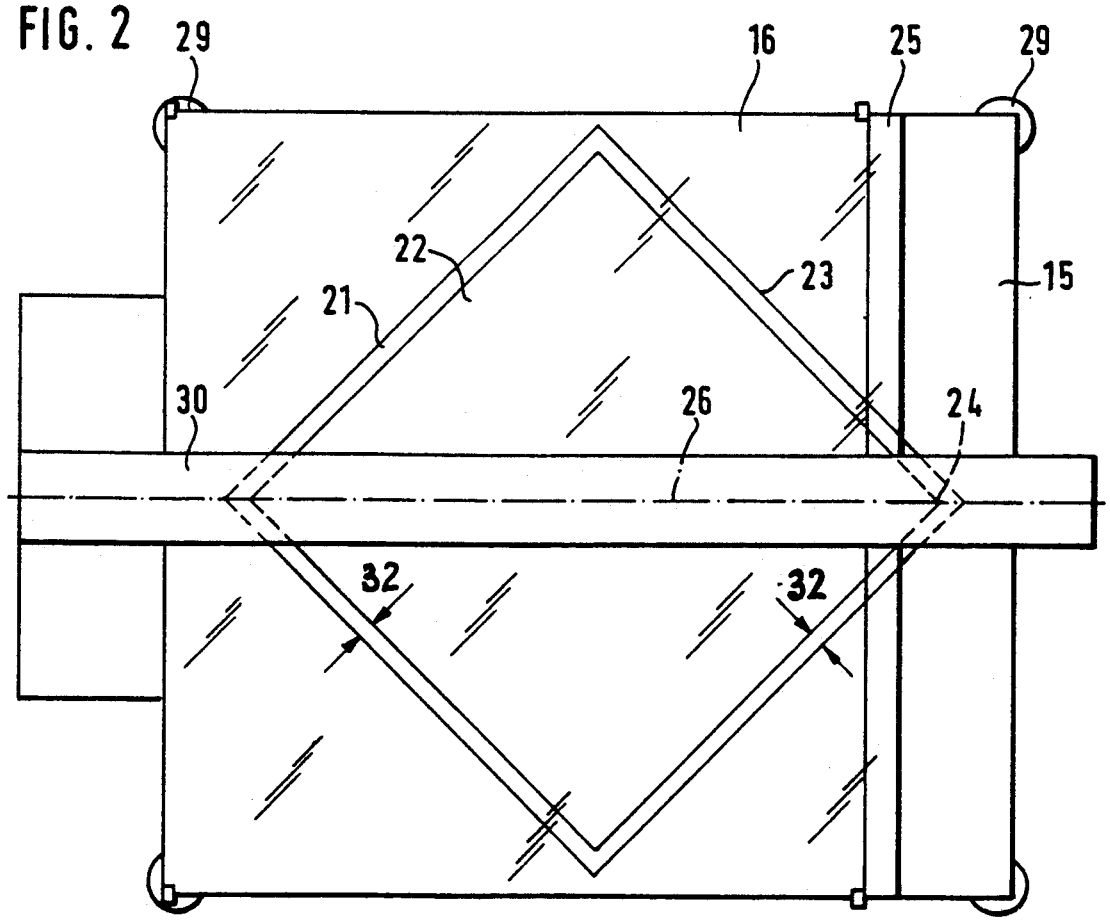
FIG. 2 is a top plan view of the apparatus according to FIG. 1.

As can be seen from FIG. 2, the film 22 is laminated onto the carrier material 21 in such a way that all around borders 32 of the carrier material 21 remain free from the laminated-on film 22. The laminate 23, comprising the carrier material 21 and the film 22, is arranged between the base plate 15 and the plate 16 in such a way that the diagonal 26 of the rectangular or square laminate is aligned in the advancing direction of the separating apparatus 10. A film corner 24 of the film 22 lies on the diagonal 26.

Figure 3:
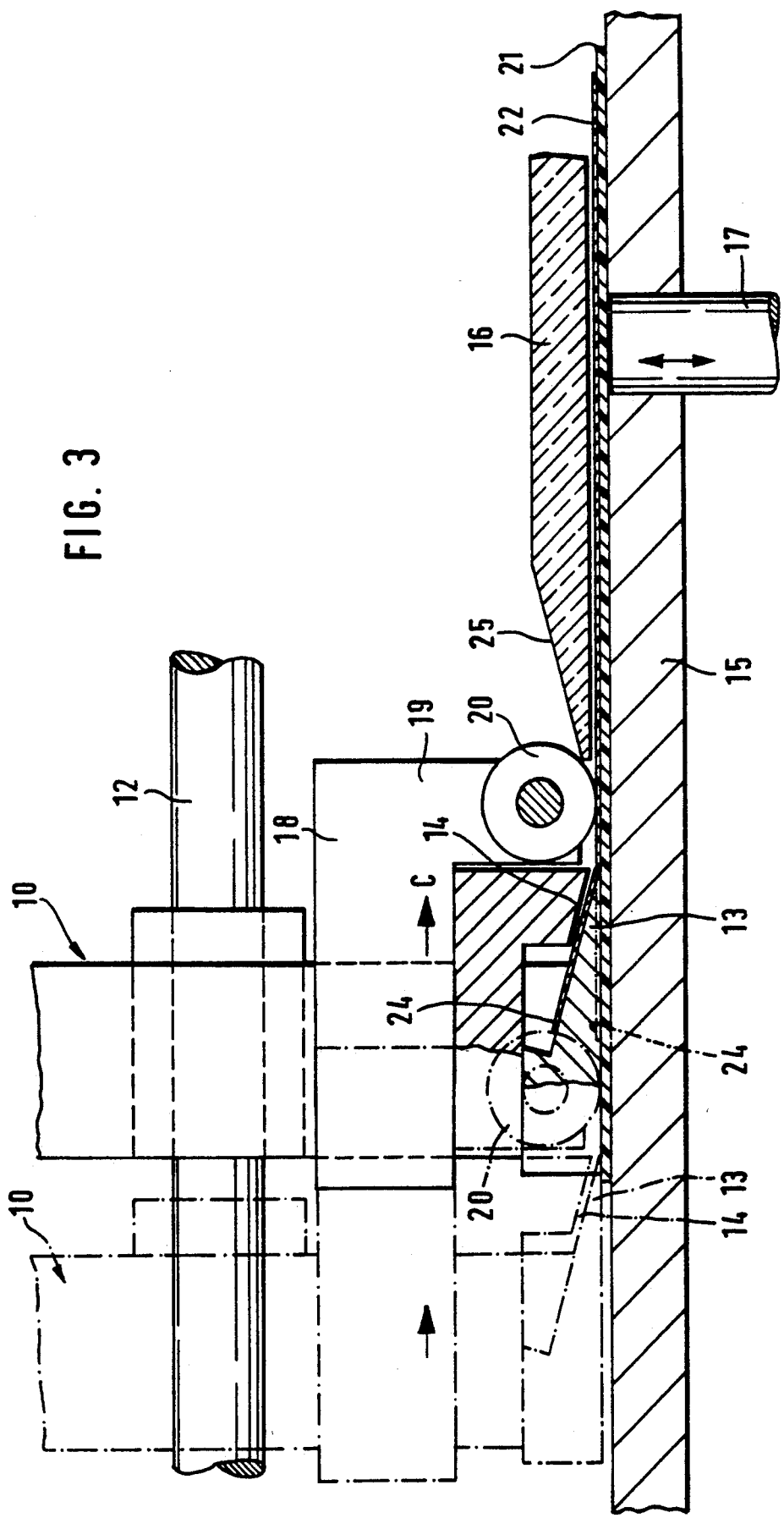
FIG. 3 is a sectional side view of a part of the apparatus showing a position of the separating apparatus directly before a corner of the film is to be detached from a carrier material.

As can be seen from FIG. 3, the separating apparatus 10 has a wedge-shaped separating knife 13. A gap 14 runs parallel to the knife 13 and is inclined obliquely to a horizontal plane with the same inclination as the upper face of the wedge-shaped separating knife. In FIG. 3, two positions of the separating apparatus 10, in the advancing direction are represented. In the first, left-hand position, represented by dot-dashed lines, the separating apparatus 10, and consequently the separating knife 13, are located just ahead of the film corner 24, such that a detachment of the film corner 24 from the carrier material 21 has not yet taken place. The separating apparatus 10 is fastened on the underside of an angled frame 18, which has a horizontal leg and a vertical leg 19. In the lower end of the vertical leg 19, a roller 20, is rotatably mounted such that during advancement of the separating apparatus 10, the roller 20 initially rolls over the laminate 23. In the second, right-hand position in FIG. 3, as represented by solid lines, the wedge-shaped separating knife 13 has detached the film corner 24 of the film 22 from the carrier material 21, and has threaded the film corner 24 into the gap 14. The roller 20 is then located directly at the front side, i.e. at the beginning of the bevel 25 of the plate 16. In this position of the separating apparatus 10, the stay 17, which passes vertically through the base plate 15, presses the laminate 23 against the underside of the plate 16, and holds it firmly in place, so that the detached film corner 24 can be threaded into the gap 14 without difficulty. The stay 17 can be raised and lowered pneumatically or hydraulically. The pneumatic or hydraulic apparatus required for this is known in the prior art and is therefore not represented in the drawings.

The separating knife 13 forms, to a certain extent, the underside of the gap 14, which makes an angle with the horizontal in the range from 5° to 25°, and preferably from 10° to 20°, in the advancing direction of the separating apparatus 10. In a specific illustrative embodiment, the angle of the gap with the horizontal plane is 15°. The gap length is equal to or greater than 20 mm. In particular, a gap length of 30 mm has proven favorable in tests. The film corner 24 is generally threaded up to 20 mm into the gap. During the further advancement of the separating apparatus, the threaded film corner 24 is held firm in the gap in a self-clamping manner by the separating knife 13.

Figure 4:
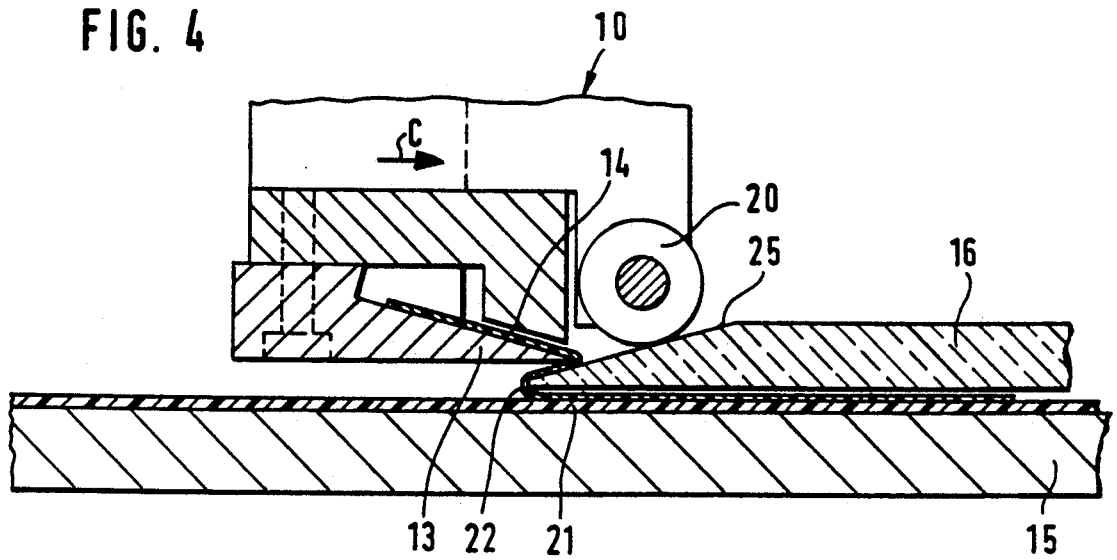
FIG. 4 is a sectional side view of a part of the apparatus showing the separating apparatus running onto a bevel of a plate, with a corner of the film threaded into a gap.

FIG. 4 shows a position of the separating apparatus 10 in which the roller 20 is moving up on the bevel 25 of the plate 16 and, as a result, the separating apparatus 10 is lifted off the laminate 23. In this connection, it should be pointed out that the separating apparatus 10 is displaceable in the vertical direction with respect to the base plate 15. In this position, the film 22 is led in a bent manner around the front edge or around the starting edge of the bevel 25, and through a further bend, which is opposite to the first bend, is threaded into the gap 14 of the separating apparatus 10. In this position, the laminate 23 is no longer held firm by the stay 17, which has been lowered down.

Figure 5:
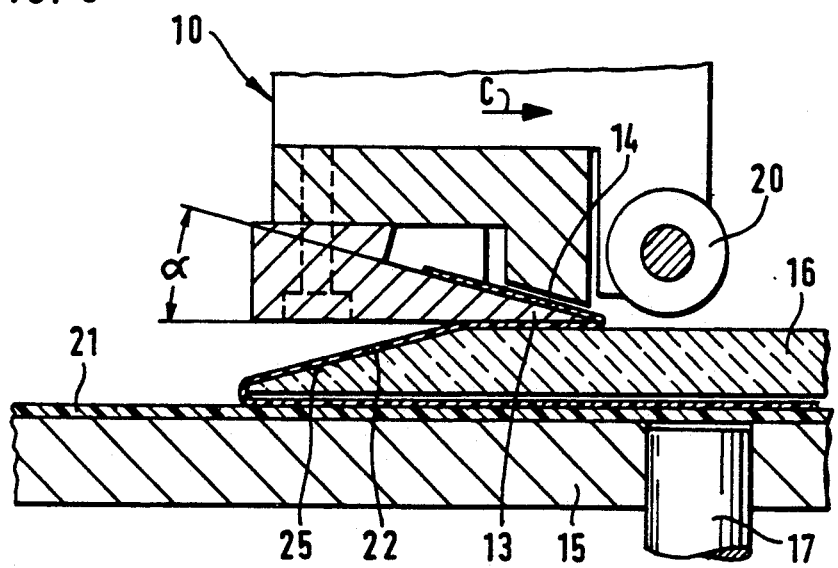
FIG. 5 is a sectional side view of a part of the apparatus showing the separating apparatus having run onto the upper side of the plate, with a film being partly detached from the carrier material.

In FIG. 5, a position of the separating apparatus 10 is shown in which said apparatus is moving along over the surface of the plate 16. The angle α of the wedge-shaped separating knife 13 lies in the previously specified angular range for the gap 14, or is 15° such as the previously mentioned preferred illustrative embodiment of the gap 14. In this position, the roller 20 has been lifted off the upper side of the plate 16, because the lowest point of the roller 20 lies above the plane of the horizontal face of the wedge-shaped cutting knife 13, as can be seen for example from FIG. 5. This measure is required in order for the separating knife 13 to detach the film corner 24 from the carrier material 21 without having any problems. It can also be seen from FIG. 5 that the stay 17 has been lowered and does not contact the underside of the laminate or of the carrier material. The advancing direction of the separating apparatus 10 is indicated in FIGS. 3 to 5 by the arrow C.

The separating and drawing-off of the film from the carrier material proceeds as follows:

The laminate 23, comprising the film 22 and the carrier material 21, is pushed along its diagonal between the base plate 15 and the plate 16. The base plate 16 lies a small distance above plate 15 and has bevel 25 on its running-in side. At the start of the operation of the apparatus, the laminate 23 is held firm on the underside by the stay 17. Measured diagonally, the upper film 22, which is to be drawn off, lies approximately 2 cm behind the front edge of the carrier material 21. In other words, the border 32 of the carrier material 21, which does not have film thereon, is 2 cm.

The motor drives the spindle 12, which in turn advances the lightly pressed-on separating knife 13, in the direction of the carrier material 21 and the front edge or the film corner 24 of the film 22. When the separating knife 13 engages the film corner 24, it detachs the film corner 24 from the carrier material 21. The film corner 24 of the film 22 is pushed approximately 20 mm into the gap 14 which is situated above the separating knife 13. The stay 17, fixing the laminate 23 from the underside, is then returned to its starting position, and releases the laminate. Subsequently, the separating knife 13, guided by the roller 20, runs over the bevel 25 located on the front side of the plate 16. As a result, the film 22 located in the gap 14 is bent around at an angle of 5° to 20°, and in particular 15°, and a self-clamping holding is produced between the separating knife 13 and the film 22 in the gap 14.

The separating operation is continued by the further advancement of the separating knife 13, and the two parts 21, 22 which are laminated one on top of the other are detached from each other and separated from each other in opposite directions.

Figure 6:
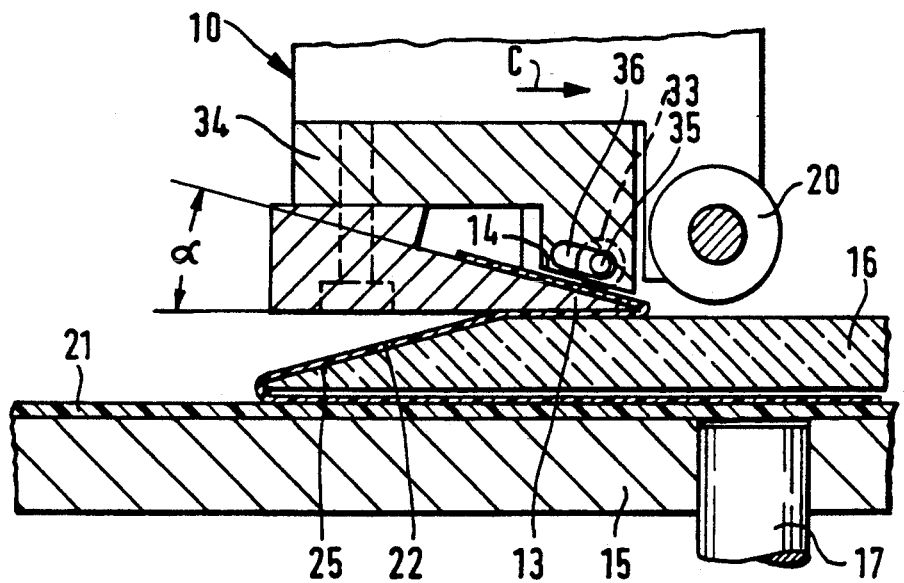
FIG. 6 is a sectional side view of a further embodiment of the separating apparatus, which contains a pressure roller in a separating knife head.

In FIG. 6, a further embodiment of the separating apparatus 10 is shown, which differs in comparison with the separating apparatus according to FIGS. 3 to 5, in that it contains a pressure roller 33 in a separating knife head 34, the separating knife head 34 being screwed to the separating knife 13. The pressure roller 33 is mounted by its axle journals 35 in mutually parallel oblong holes 36, and touches the upper side of the wedge-shaped separating knife 13 so that it rolls up and down along the upper side of the separating knife 13 during the back and forth movement of the separating apparatus 10. The oblong holes 36 run in the separating knife head 34 at an inclination with respect to the oblique gap 14. The pressure roller 33 exerts an additional clamping pressure on the film corner which is inserted into the gap 14, thereby assisting the self-clamping feature of the invention in cases involving large-format and correspondingly heavy laminates, or thin carrier materials, which do not fully fill the oblique gap due to their small thickness. Without this feature, the thin carrier materials would only experience a weak self-clamping.

Other objects, features and advantages of the present invention will become apparent to those skilled in the art from the foregoing detailed description. It should be understood, however, that the detailed description and specific examples, while indicating preferred embodiments of the present invention, are given by way of illustration ad not limitation. Many changes and modifications within the scope of the present invention may be made without departing from the spirit thereof, and the invention includes all such modifications.

What is claimed is:

1. An apparatus for separating and drawing off a film from a laminate, said laminate including said film and a carrier material upon which said film is laminated, said apparatus comprising:
   a first plate;
   a second plate being disposed above said first plate;
   a motor;
   a spindle being operatively connected to said motor;
   a separating apparatus being movable along said spindle above said first plate and including
      a wedge-shaped separating knife,
      a gap lying above and parallel to said separating knife, said gap being inclined at an oblique angle relative to a horizontal plane; and
      a stay passing vertically through said first plate for holding an underside of said laminate firmly in place;
   wherein said laminate rests on said first plate, said separating apparatus moves into engagement with a corner of said film so that said corner is detached from said carrier material and is threaded into said gap, and said stay holds the underside of said laminate firmly in place when said corner is threaded into said gap.

2. An apparatus as claimed in claim 1, further comprising an angled frame having a vertical leg, and a roller which is rotatably mounted at the lower end of said vertical leg, and wherein separating apparatus is fastened to the underside of said angled frame.

3. The apparatus as claimed in claim 2, wherein a front side of said second plate has a bevel facing said separating apparatus such that said separating apparatus runs over said bevel and onto an upper side of said second plate with the aid of said roller.

4. An apparatus as claimed in claim 2, wherein said separating knife has a sloping upper side, and said separating apparatus further comprises a separating knife head disposed above said gap and a pressure roller disposed in said separating knife head such that said pressure roller can be moved back and forth on said sloping upper side.

5. An apparatus as claimed in claim 4, wherein said separating knife head has a pair of mutually parallel oblong holes therein which are inclined relative to said gap, said pressure roller has axle journals, and said axle journals are mounted in said oblong holes.

6. An apparatus as claimed in claim 1, wherein said separating knife forms the underside of said gap, and said oblique angle is in a range of from 5° to 25° as viewed in a direction of advancement of said separating apparatus toward engagement with said corner of said film.

7. An apparatus as claimed in claim 6, wherein said separating knife has a sloping upper side, and said separating apparatus further comprises a separating knife head disposed above said gap and a pressure roller disposed in said separating knife head such that said pressure roller can be moved back and forth on said sloping upper side.

8. An apparatus as claimed in claim 7, wherein said separating knife head has a pair of mutually parallel oblong holes therein which are inclined relative to said gap, said pressure roller has axle journals, and said axle journals are mounted in said oblong holes.

9. An apparatus as claimed in claim 1, wherein the length of said gap is $\geq 20$ mm.

10. An apparatus as claimed in claim 9, wherein said separating knife has a sloping upper side, and said separating apparatus further comprises a separating knife head disposed above said gap and a pressure roller disposed in said separating knife head such that said pressure roller can be moved back and forth on said sloping upper side.

11. An apparatus as claimed in claim 10, wherein said separating knife head has a pair of mutually parallel oblong holes therein which are inclined relative to said gap, said pressure roller has axle journals, and said axle journals are mounted in said oblong holes.

12. The apparatus as claimed in claim 9, wherein the length of said gap is approximately 30 mm.

13. An apparatus as claimed in claim 12, wherein said separating knife has a sloping upper side, and said separating apparatus further comprises a separating knife head disposed above said gap and a pressure roller disposed in said separating knife head such that said pressure roller can be moved back and forth on said sloping upper side.

14. An apparatus as claimed in claim 13, wherein said separating knife head has a pair of mutually parallel oblong holes therein which are inclined relative to said gap, said pressure roller has axle journals, and said axle journals are mounted in said oblong holes.

15. The apparatus as claimed in claim 1, wherein a front side of said second plate has a bevel facing said separating apparatus such that said separating apparatus runs upward over said bevel and onto an upper side of said second plate with the aid of a roller attached to a frame which holds the separating apparatus.

16. The apparatus as claimed in claim 1, wherein said second plate is made from a transparent material.

17. The apparatus as claimed in claim 1, wherein said stay is raised and lowered pneumatically or hydraulically.

18. The apparatus as claimed in claim 1, wherein said film is a color film and said laminate is rectangular in shape and is arranged between the first and second plates so that the diagonal of said laminate is in a direction of advancement of said separating apparatus toward engagement with said corner of said film.

19. An apparatus as claimed in claim 18, wherein said laminate is square in shape.

20. The apparatus as claimed in claim 1, wherein said carrier material is a film.

21. The apparatus as claimed in claim 1, wherein said carrier material is a circuit board with a photoresist pattern exposed thereon, and said film is a protective film.

22. An apparatus as claimed in claim 1, wherein said separating knife forms the underside of said gap, and said oblique angle is in a range from 10° to 20° as viewed in a direction of advancement of said separating apparatus toward engagement with said corner of said film.

23. An apparatus as claimed in claim 1, wherein said transparent material is glass or plastic.

24. An apparatus as claimed in claim 1, wherein said separating knife has a sloping upper side, and said separating apparatus further comprises a separating knife head disposed above said gap and a pressure roller disposed in said separating knife head such that said pressure roller can be moved back and forth on said sloping upper side.

25. An apparatus as claimed in claim 24, wherein said separating knife head has a pair of mutually parallel oblong holes therein which are inclined relative to said gap, said pressure roller has axle journals, and said axle journals are mounted in said oblong holes.

26. A method for removing a film from a carrier material, said film being laminated on said carrier material to form a laminate, said method comprising the steps of:

A) advancing a separating apparatus having a separating knife and a gap which runs at an oblique angle to a horizontal plane, toward the film;
B) aligning a diagonal of the film along the advancing direction of the separating apparatus;
C) engaging the separating knife with a corner of the film thereby detaching the corner of the film from the carrier material;
D) threading the corner of the film into the gap;
E) using the separating knife to hold the corner of the film firmly in place in a self-clamping manner;
F) lifting the separating apparatus off of a first plate;
G) running the separating apparatus onto an upper side of a second plate which is disposed above the first plate, while concurrently performing step F); and
H) drawing the film off the carrier material due to the advancing of the separating apparatus and the performance of steps F) and G).

27. A method as claimed in claim 26, further comprising the step of raising the laminate from an underside thereof at a position which is remote from the corner of the film, so that the laminate is pressed and held firmly against the underside of the second plate, said raising step occurring prior to step C.

28. A method as claimed in claim 27, further comprising the step of releasing the laminate from being held against the underside of the second plate subsequent to steps D and E.

29. A method as claimed in claim 26, further comprising the step of applying a clamping pressure on the corner of the film when the corner of the film is in the gap, said clamping pressure being in addition to the self-clamping provided by the separating knife.

* * * * *